(12) United States Patent
Asao

(10) Patent No.: US 7,529,114 B2
(45) Date of Patent: May 5, 2009

(54) SEMICONDUCTOR MEMORY DEVICE

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 11/861,878

(22) Filed: Sep. 26, 2007

(65) Prior Publication Data
US 2008/0239782 A1 Oct. 2, 2008

(30) Foreign Application Priority Data
Oct. 3, 2006 (JP) ............................. 2006-272056

(51) Int. Cl.
G11C 5/06 (2006.01)
G11C 11/00 (2006.01)
G11C 11/14 (2006.01)
(52) U.S. Cl. ........................ 365/63; 365/51; 365/148; 365/158; 365/163; 365/171
(58) Field of Classification Search .................... 365/63
See application file for complete search history.

(56) References Cited

U.S. PATENT DOCUMENTS

| | | | | |
|---|---|---|---|---|
| 6,826,076 B2* | 11/2004 | Asano et al. | ................. | 365/158 |
| 7,016,222 B2* | 3/2006 | Morikawa | .................... | 365/158 |
| 7,038,939 B2* | 5/2006 | Amano et al. | ................ | 365/158 |
| 7,042,753 B2* | 5/2006 | Horiguchi | .................... | 365/130 |
| 7,057,922 B2* | 6/2006 | Fukumoto | .................... | 365/158 |
| 7,145,795 B2* | 12/2006 | Ghodsi | ........................ | 365/158 |
| 7,286,395 B2* | 10/2007 | Chen et al. | ................... | 365/158 |
| 7,405,965 B2* | 7/2008 | Choi et al. | ................... | 365/163 |
| 7,411,208 B2* | 8/2008 | Hwang et al. | ................... | 257/4 |
| 7,414,879 B2* | 8/2008 | Asao et al. | ................... | 365/158 |
| 7,453,716 B2* | 11/2008 | Kim et al. | .................... | 365/148 |
| 2007/0285972 A1* | 12/2007 | Horii et al. | ................... | 365/148 |

FOREIGN PATENT DOCUMENTS

JP 2005-191523 7/2005

* cited by examiner

Primary Examiner—Son L Mai
(74) Attorney, Agent, or Firm—Oblon, Spivak, McClelland, Maier & Neustadt, P.C.

(57) ABSTRACT

A semiconductor memory device includes a bit line which is provided above a semiconductor substrate and runs in a first direction, a source line which is provided above the semiconductor substrate and runs in the first direction, an active area which is provided in the semiconductor substrate and extends in the first direction, first and second selection transistors which are formed on the active area and share a source region electrically connected to the source line, a first memory element having one end electrically connected to a drain region of the first selection transistor and the other end electrically connected to the bit line, and a second memory element having one end electrically connected to a drain region of the second selection transistor and the other end electrically connected to the bit line.

20 Claims, 11 Drawing Sheets

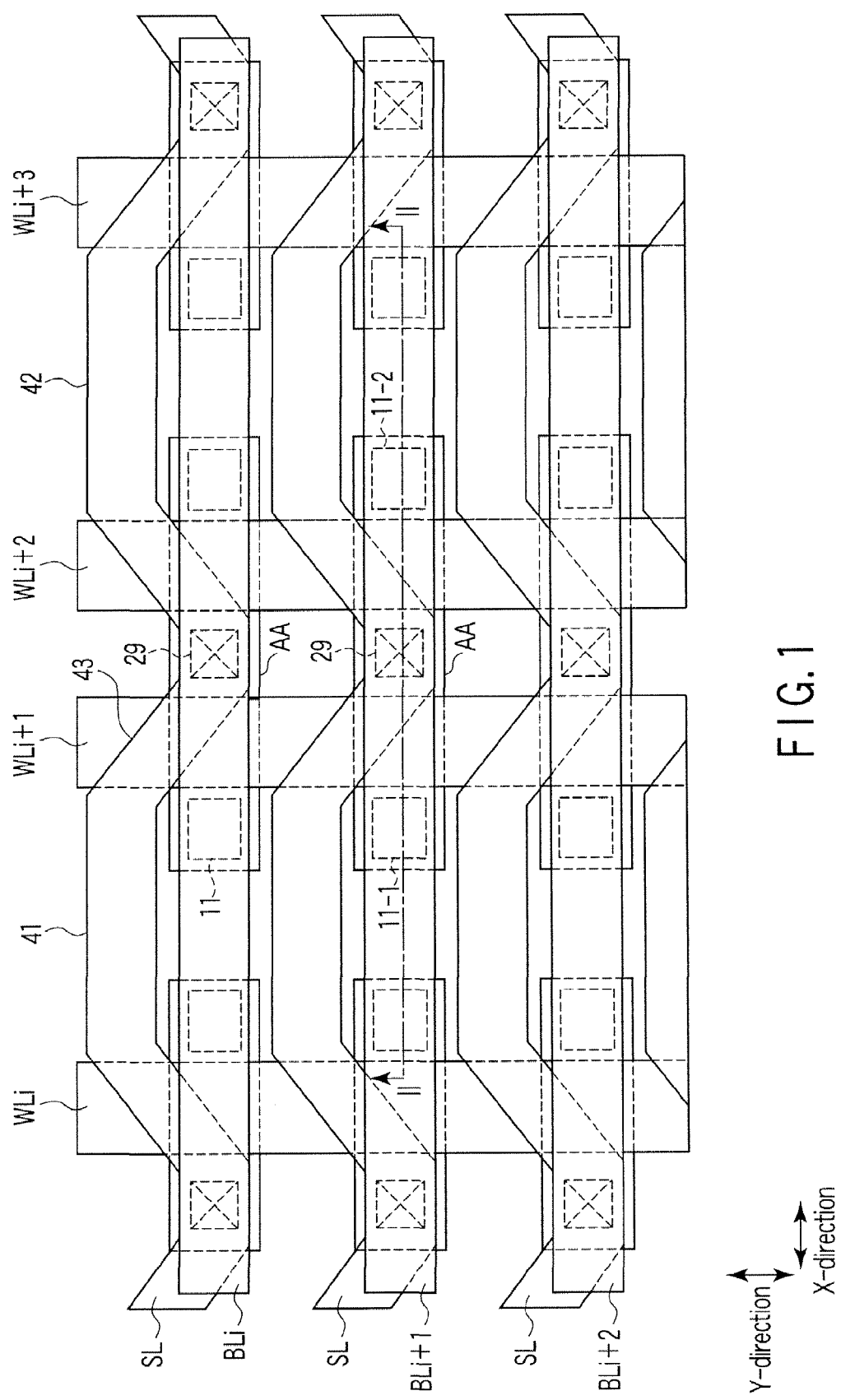
F I G. 1

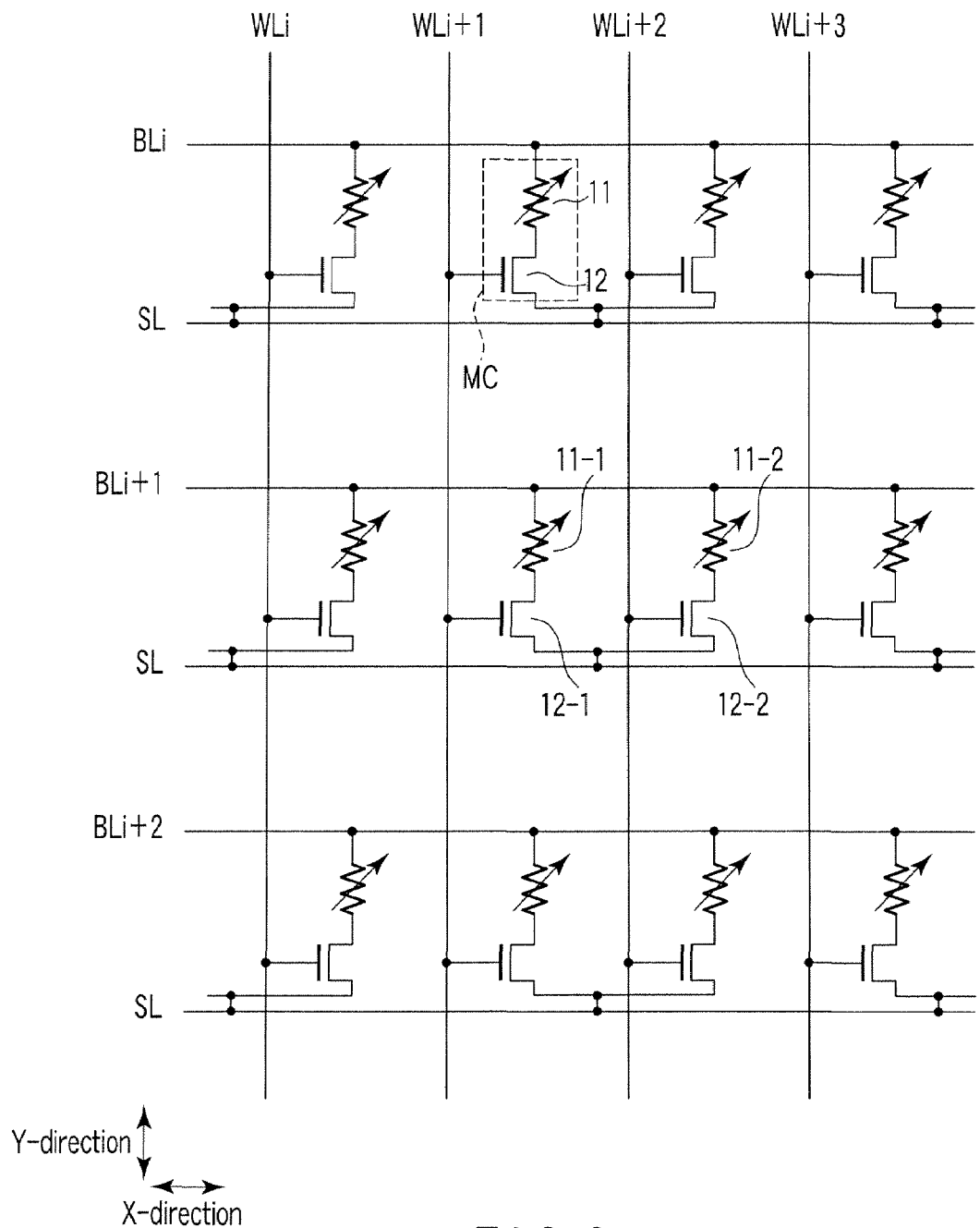
F I G. 3

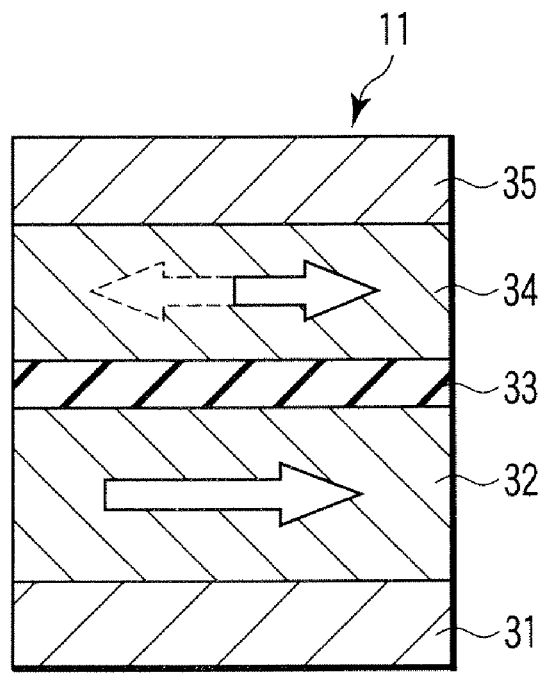
F I G. 4
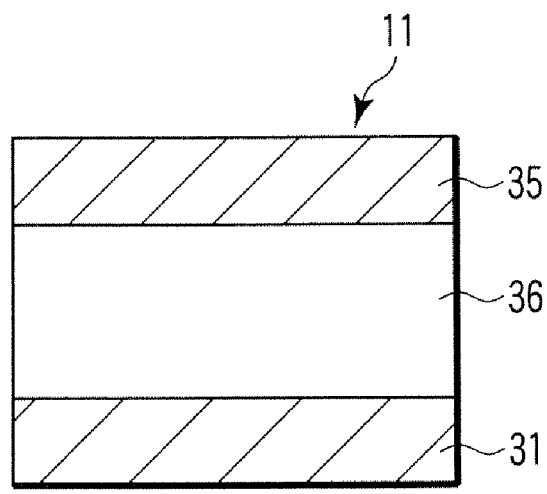
F I G. 5

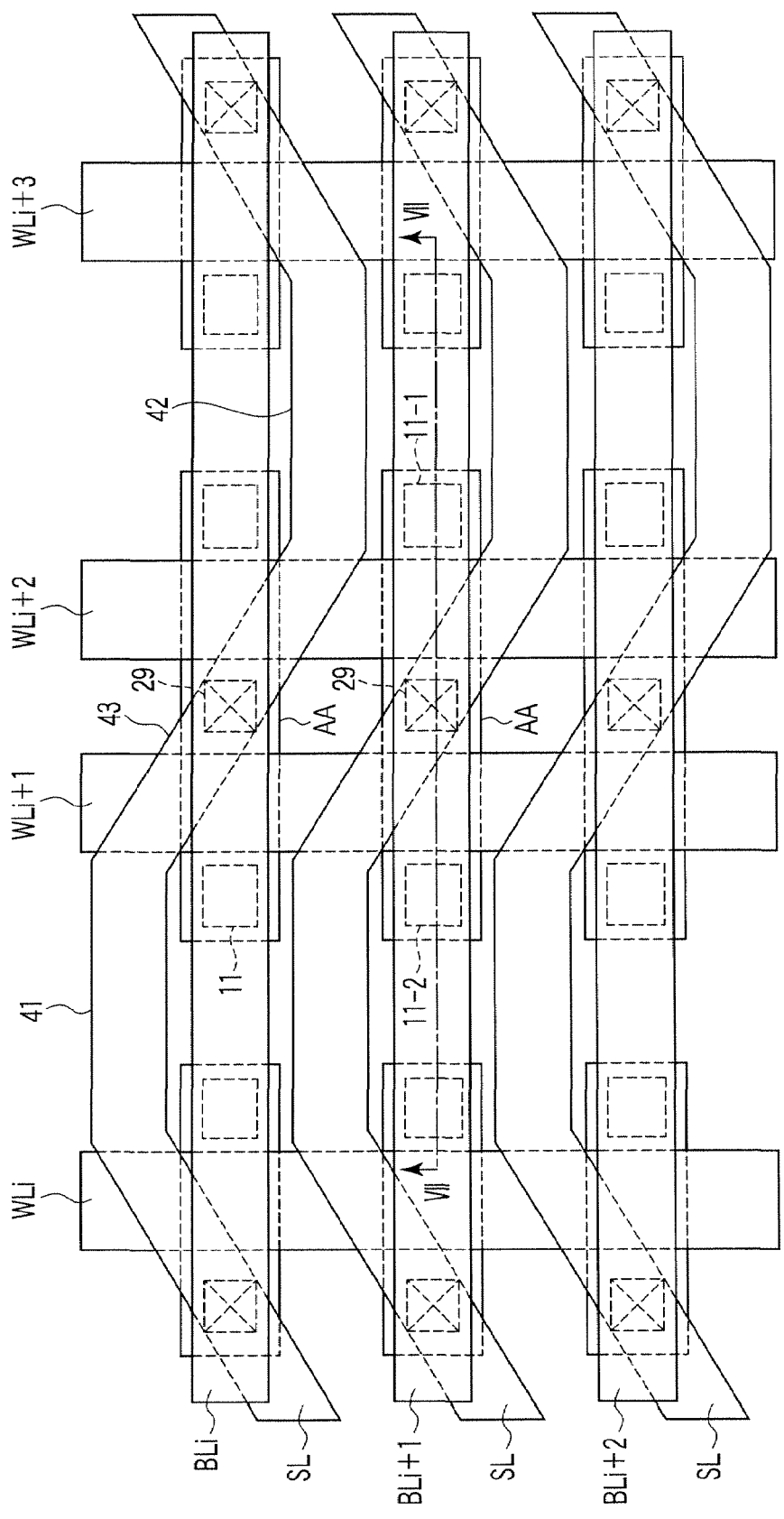
F I G. 6

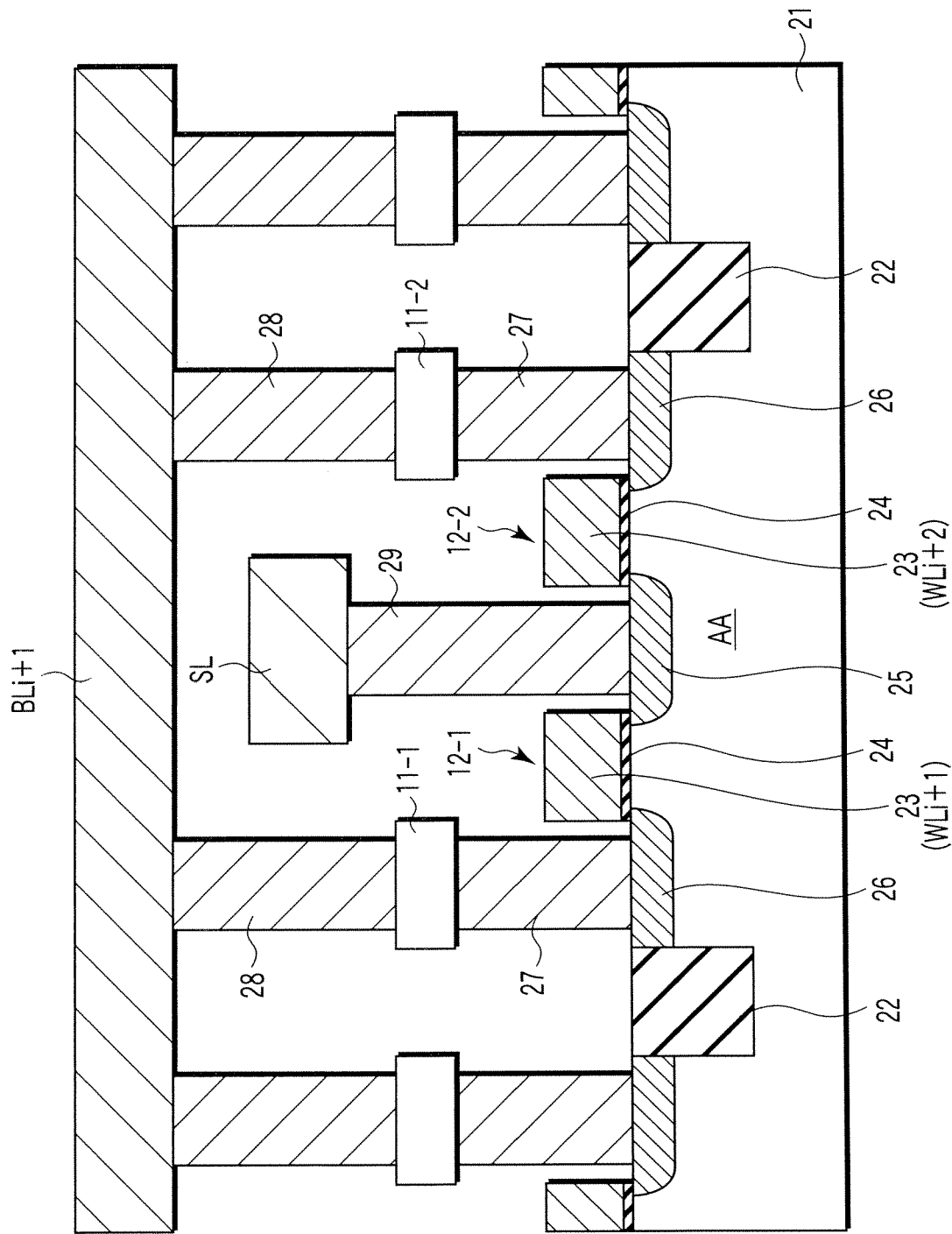
F I G. 7

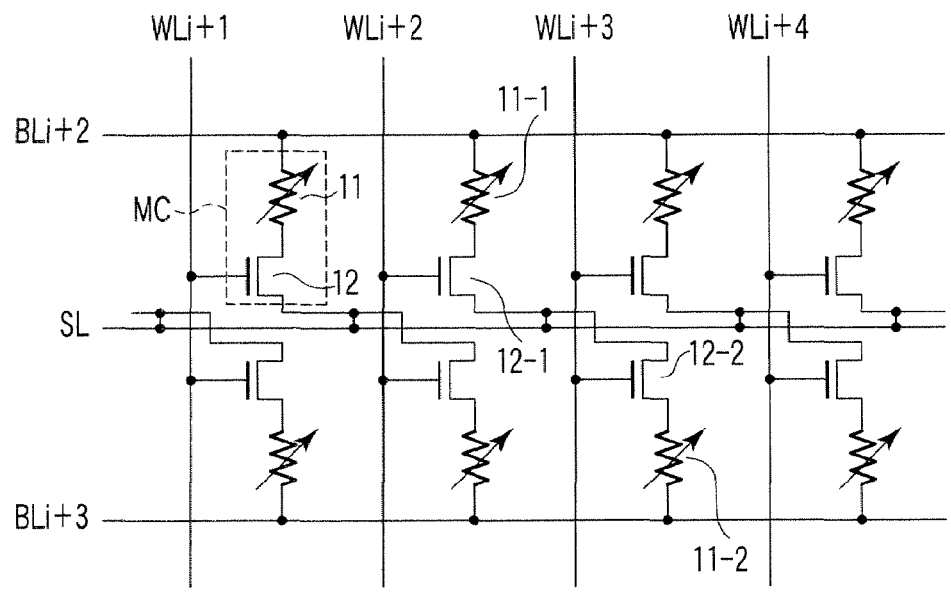
F I G. 10
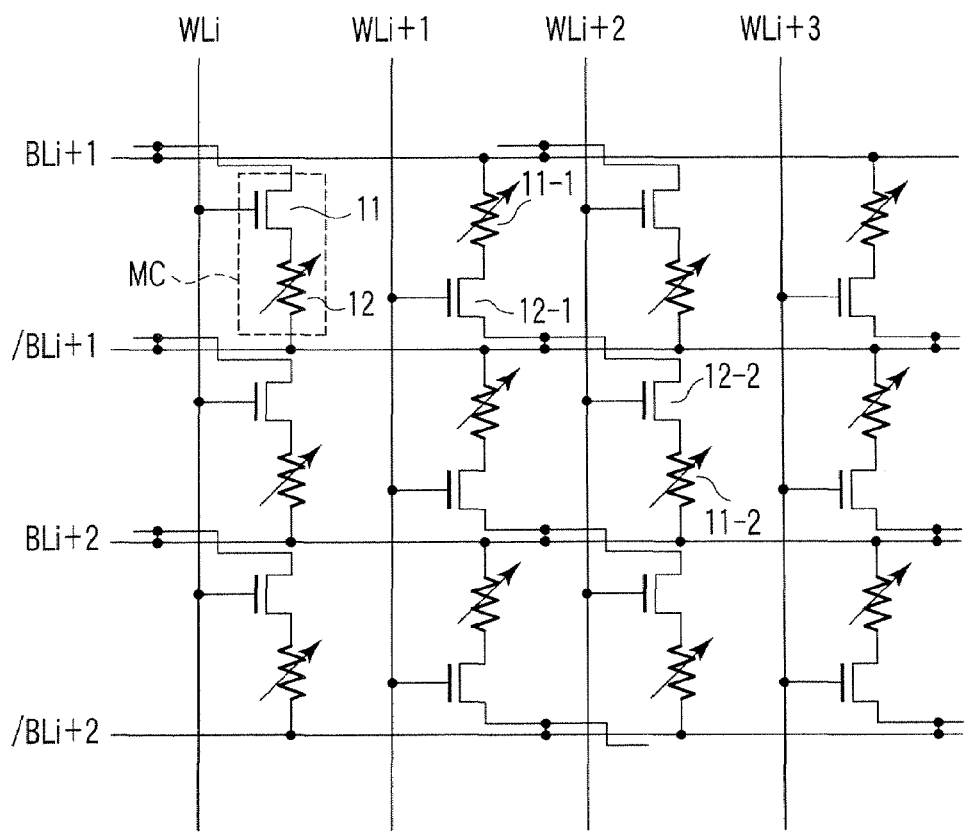
F I G. 13

SEMICONDUCTOR MEMORY DEVICE

CROSS-REFERENCE TO RELATED APPLICATIONS

This application is based upon and claims the benefit of priority from prior Japanese Patent Application No. 2006-272056, filed Oct. 3, 2006, the entire contents of which are incorporated herein by reference.

BACKGROUND OF THE INVENTION

1. Field of the Invention

The present invention relates to a semiconductor memory device and, more particularly, to, e.g., a semiconductor memory device having a memory element which records information in accordance with a change in resistance value.

2. Description of the Related Art

In recent years, there are proposed a variety of solid-state memories which record information on the basis of a new principle. Of these proposals, a magnetic random access memory (MRAM) using the tunneling magnetoresistive (TMR) effect is attracting a great deal of attention as a solid-state magnetic memory. The characteristic feature of the MRAM is that it stores data in accordance with the magnetization state of a magnetic tunnel junction (MTJ) element.

In a conventional MRAM which writes data on the basis of a magnetic field generated by a current flowing to an interconnection, a reduction in the size of an MTJ element increases the coercive force. This often increases a current necessary for writing. It is therefore difficult for the conventional MRAM to satisfy both the micropatterning of cells and the decrease in current consumption aiming at an increase in capacity.

To overcome this drawback, a spin-injection-type MRAM using a spin momentum transfer (SMT) write scheme is proposed. The spin-injection-type MRAM writes data on the basis of a current flowing to an MTJ element in a direction perpendicular to the film plane, and changes the spin direction of a free layer in accordance with the direction of this current. One memory cell includes one MTJ element and one selection transistor. For example, this selection transistor shares a source region with its adjacent cell to reduce the cell area.

Assume, however, that two selection transistors share a source region in the spin-injection-type MRAM. To supply the source potential via an interconnection, there are available two methods, i.e., (1) a method of arranging a source potential interconnection parallel to the gate electrodes of the selection transistors, and (2) a method of arranging a source potential interconnection in a direction perpendicular to the gate electrodes of the selection transistors. In (2), on an active area arranged perpendicular to the gate electrodes of the selection transistors, a contact cannot be directly formed in the source region of the selection transistors from the source potential interconnection.

A related technique of this type has been disclosed, which decreases the number of interconnections by arranging MRAM cells such that one write word line is necessary for every two word lines while one ground line is necessary for every two bit lines (see Jpn. Pat. Appln. KOKAI Publication No. 2005-191523).

BRIEF SUMMARY OF THE INVENTION

According to a first aspect of the present invention, there is provided a semiconductor memory device comprising: a semiconductor substrate; a bit line which is provided above the semiconductor substrate and runs in a first direction; a source line which is provided above the semiconductor substrate and runs in the first direction; an active area which is provided in the semiconductor substrate and extends in the first direction; a first selection transistor and a second selection transistor which are formed on the active area and share a source region electrically connected to the source line; a first memory element having one end electrically connected to a drain region of the first selection transistor and the other end electrically connected to the bit line; and a second memory element having one end electrically connected to a drain region of the second selection transistor and the other end electrically connected to the bit line. The source line includes a first interconnection portion and a second interconnection portion which run in the first direction and are adjacent to the bit line in a second direction perpendicular to the first direction, and a third interconnection portion which connects the first interconnection portion to the second interconnection portion and is electrically connected to the source region.

According to a second aspect of the present invention, there is provided a semiconductor memory device comprising: a semiconductor substrate; an active area which is provided in the semiconductor substrate and extends in a first direction; a first selection transistor and a second selection transistor which are provided on the active area and share a source region; a first memory element having one end electrically connected to a drain region of the first selection transistor; a second memory element having one end electrically connected to a drain region of the second selection transistor; a first interconnection and a second interconnection which are provided above the semiconductor substrate, are electrically connected to the other ends of the first memory element and the second memory element, respectively, and run in an oblique direction with respect to the first direction; and a third interconnection which is provided above the semiconductor substrate, is electrically connected to the source region, and runs in the oblique direction.

BRIEF DESCRIPTION OF THE SEVERAL VIEWS OF THE DRAWING

FIG. 1 is a plan view illustrating the arrangement of a semiconductor memory device according to a first embodiment of the present invention;

FIG. 3 is a circuit diagram of the MRAM shown in FIG. 1;

FIG. 4 is a sectional view illustrating the arrangement of an MTJ element 11;

FIG. 5 is a sectional view illustrating the arrangement of a phase-change element 11;

FIG. 6 is a plan view illustrating the arrangement of an MRAM according to a second embodiment of the present invention;

FIG. 7 is a sectional view of the MRAM taken along a line VII-VII in FIG. 6;

FIG. 10 is a circuit diagram of the MRAM shown in FIG. 8;

FIG. 13 is a circuit diagram of the MRAM shown in FIG. 11.

DETAILED DESCRIPTION OF THE INVENTION

Figure 2:
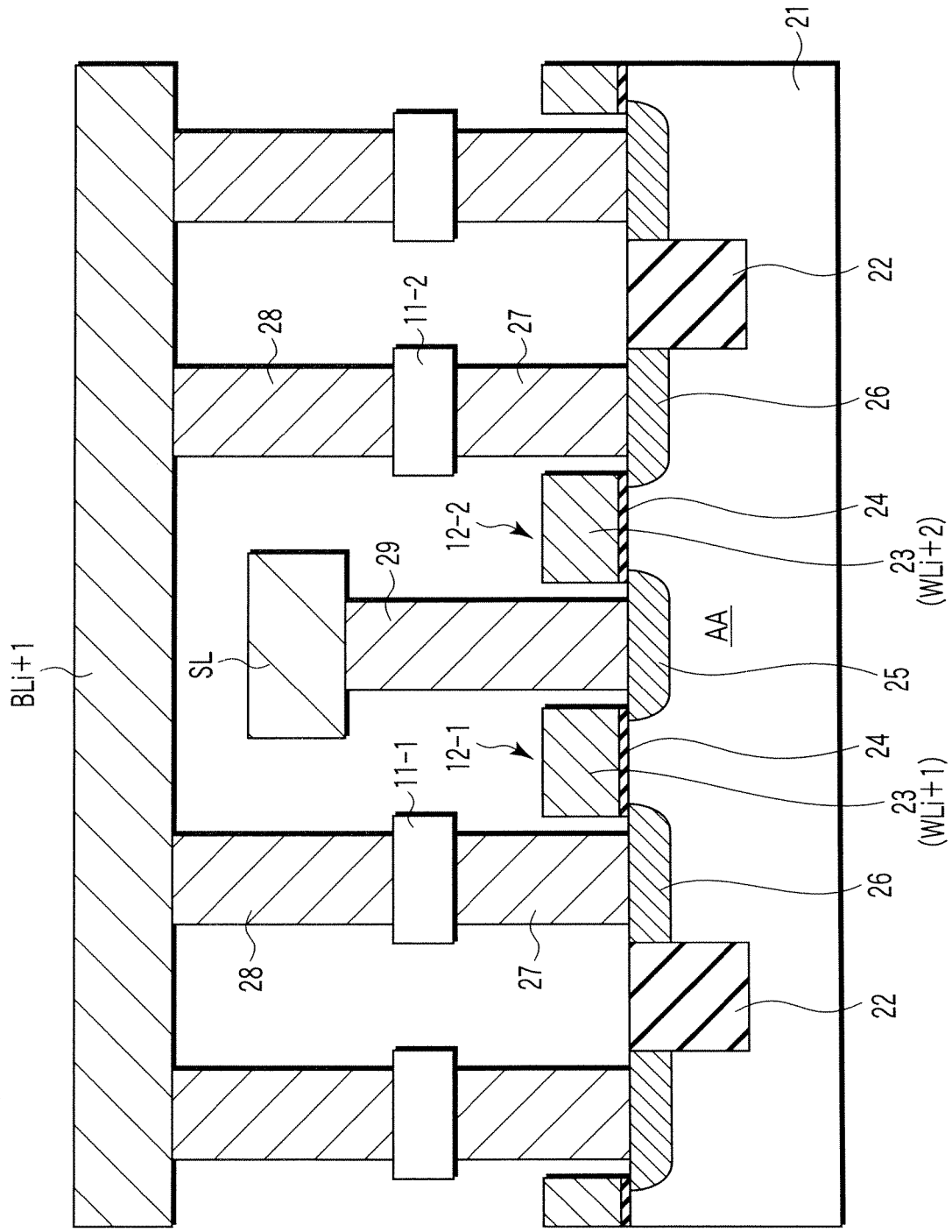
FIG. 2 is a sectional view of the semiconductor memory device taken along a line II-II in FIG. 1.

Embodiments of the present invention will be described below with reference to the accompanying drawing. In the following description, the same reference numerals denote constituent elements having the same function and arrangement, and a repetitive description thereof will be made only when necessary.

First Embodiment

FIG. 1 is a plan view illustrating the arrangement of a semiconductor memory device according to the first embodiment of the present invention. FIG. 2 is a sectional view of the semiconductor memory device taken along a line II-II in FIG. 1. For the sake of easy understanding of the arrangement, an illustration (hatching) of an interlayer dielectric film formed between a substrate and an interconnection layer is omitted in FIG. 2.

In the first embodiment, a memory element 11 which stores information uses an MTJ element 11. That is, the semiconductor memory device shown in FIG. 1 is formed by an MRAM.

Referring to FIG. 2, examples of a P-type conductive substrate 21 are a P-type semiconductor substrate, a semiconductor substrate having a P-type well, and a silicon-on-insulator (SOI) substrate having a P-type semiconductor layer. The semiconductor substrate 21 uses, e.g., silicon (Si). Element isolation insulating layers 22 are formed in some surface regions of the semiconductor substrate 21. Some other surface regions of the semiconductor substrate 21, where no element isolation insulating layers 22 are formed, serve as a plurality of active areas AA on which elements are to be formed. The element isolation insulating layer 22 is formed by, e.g., shallow trench isolation (STI). STI 22 uses, e.g., silicon oxide.

Each active area AA extends in the X-direction within the semiconductor substrate 21. Two selection transistors 12 are formed on each active area AA. More specifically, a source region 25 and drain regions 26 are formed on each active area AA. Each of the source region 25 and drain regions 26 includes an $N^+$-type diffusion region formed by doping a high-concentration $N^+$-type impurity (e.g., phosphorus [P] or arsenic [As]) into the active area AA.

A gate electrode 23 is formed between the source region 25 and each drain region 26 above the active area (i.e., above the channel region) via a gate insulating film 24 to run in the Y-direction. The gate electrodes 23 correspond to word lines WL shown in FIG. 1. The gate insulating film 24 uses, e.g., silicon oxide. The gate electrode 23 uses, e.g., polycrystalline silicon.

An MTJ element 11 is formed above each drain region 26 via a contact layer 27. The planar shape of the MTJ element 11 is not particularly limited, and may be a quadrangle, circle, or ellipse. The first embodiment shows a quadrangle as an example. A bit line BL runs in the X-direction over the MTJ elements 11 via contact layers 28. A source line SL runs in the X-direction above the source region 25 via a contact layer 29.

The two selection transistors 12 formed on the same active area AA share the source region 25. The two selection transistors 12 connect to a common source line SL via the source region 25. As shown in FIG. 2, two selection transistors 12-1 and 12-2 share the source region 25. The selection transistor 12-1 connects to an MTJ element 11-1 via a contact layer 27.

The selection transistor 12-2 connects to an MTJ element 11-2 via another contact layer 27. The MTJ elements 11-1 and 11-2 connect to the same bit line BLi+1 via the contact layers 28.

A first metal interconnection layer M1 includes the source line SL. A second metal interconnection layer M2 formed on the first metal interconnection layer M1 via an interlayer dielectric film includes the bit line BL.

FIG. 3 is a circuit diagram of the MRAM shown in FIG. 1. The MRAM comprises a plurality of bit lines BL (in the first embodiment, bit lines BLi to BLi+2) running in the X-direction, a plurality of word lines WL (in the first embodiment, word lines WLi to WLi+3) running in the Y-direction, and a plurality of source lines SL running in the X-direction. The plurality of source lines SL are electrically connected to each other.

A memory cell MC is arranged at each intersection between a bit line BL and a word line WL. One memory cell MC includes one MTJ element 11 and one selection transistor 12. One terminal of the MTJ element 11 connects to a bit line BL. The other terminal of the MTJ element 11 connects to the drain terminal of the selection transistor 12. The source terminal of the selection transistor 12 connects to a source line SL. The gate terminal of the selection transistor 12 connects to a word line WL. In the circuit diagram shown in FIG. 3, a plurality of memory cells MC adjacent to each other in the X-direction connect to the same bit line BL and the same source line SL.

The word line WL and bit line BL select the memory cell MC. A power supply circuit (not shown) applies a predetermined voltage to the bit line BL and source line SL to write and read information in/from the memory cell MC.

An arrangement of the MTJ element 11 will be explained. FIG. 4 is a sectional view illustrating the arrangement of the MTJ element 11. Referring to FIG. 4, arrows in magnetic layers indicate magnetization directions.

The MTJ element 11 has a stacked structure including a fixed layer (pinned layer) 32, a recording layer (free layer) 34, and a nonmagnetic layer 33 sandwiched between them. This stacked structure has a lower electrode 31 on its bottom surface and an upper electrode 35 on its upper surface. The lower electrode 31 and upper electrode 35 use, e.g., tantalum (Ta).

The pinned layer 32 is made of a ferromagnetic material and has a fixed magnetization (or spin) direction. The free layer 34 is made of a ferromagnetic material and has a magnetization direction which changes (reverses). The MTJ element 11 is a magnetoresistive effect element. When a current flows to the MTJ element 11 bidirectionally in directions perpendicular to the film plane (or stacking plane), it reverses the magnetization direction of the free layer 34 to record information. That is, the MTJ element 11 is a magnetoresistive effect element used for a so-called spin injection write scheme. In the spin injection write scheme, when a current flows to the MTJ element 11 bidirectionally, it transfers the spin angular momentum of the pinned layer 32 from the pinned layer 32 to the free layer 34 in accordance with the conservation law of spin angular momentum to reverse the magnetization direction of the free layer 34.

The pinned layer 32 is thicker than the free layer 34 because the magnetization direction of the pinned layer 32 is fixed. Alternatively, the magnetization direction of the pinned layer 32 may be fixed using exchange coupling by adding an antiferromagnetic layer to a ferromagnetic layer. With this arrangement, current supply has little influence on the magnetization of the pinned layer 32.

The ferromagnetic layer can use, e.g., a metal such as Fe, Co, or Ni or an alloy thereof. The antiferromagnetic layer can use, e.g., Fe—Mn, Pt—Mn, Pt—Cr—Mn, Ni—Mn, Ir—Mn, NiO, or $Fe_2O_3$. The nonmagnetic layer 33 may be made of a metal or insulator. If the nonmagnetic layer 33 is made of an insulator, the MTJ element 11 exhibits the tunneling magnetoresistive (TMR) effect. If the nonmagnetic layer 33 is made of a metal, the MTJ element 11 exhibits the giant magnetoresistive (GMR) effect. The nonmagnetic layer 33 uses an insulator such as MgO or AlO (e.g., $Al_2O_3$) or a metal such as Cu or Pt.

The MTJ element 11 having the above-described structure writes data in the following way. First, a current is supplied to the MTJ element 11 bidirectionally in directions perpendicular to the film plane (or stacking plane).

When electrons (i.e., electrons which migrate from the pinned layer 32 to the free layer 34) are supplied from the pinned layer 32, electrons spin-polarized in the same direction as the magnetization direction of the pinned layer 32 are injected into the free layer 34. In this case, the magnetization of the free layer 34 is aligned to the same direction as the magnetization direction of the pinned layer 32. The magnetization directions of the pinned layer 32 and free layer 34 thus become parallel. In this parallel alignment, the resistance value of the MTJ element 11 becomes minimum. This state is defined as data "0".

When electrons (i.e., electrons which migrate from the free layer 34 to the pinned layer 32) are supplied from the free layer 34, electrons which are reflected by the pinned layer 32 and spin-polarized in a direction reverse to the magnetization direction of the pinned layer 32 are injected into the free layer 34. In this case, the magnetization of the free layer 34 is aligned in a direction reverse to the magnetization direction of the pinned layer 32. The magnetization directions of the pinned layer 32 and free layer 34 thus become antiparallel. In this antiparallel alignment, the resistance value of the MTJ element 11 becomes maximum. This state is defined as data "1". Note that "parallel" means that two magnetic layers have the same spin direction, while "antiparallel" means that two magnetic layers have antiparallel spin directions (directions that are parallel but reverse).

Data is read by supplying a read current to the MTJ element 11. This read current is set smaller than a write current. As described above, the MTJ element 11 has a resistance value which changes depending on whether the magnetization directions of the pinned layer 32 and free layer 34 are parallel or antiparallel because of the magnetoresistive effect. The change in resistance value is detected on the basis of the read current.

As shown in FIG. 1, each source line SL has a corrugated planar shape. More specifically, each source line SL includes a first interconnection portion 41, second interconnection portion 42, and third interconnection portion 43. The first and second interconnection portions 41 and 42 run in the X-direction and are adjacent to a bit line BL in the Y-direction while being spaced at a predetermined interval in the plan view (i.e., in the projection view from above). In addition, the first and second interconnection portions 41 and 42 are adjacent to the bit line BL on the same side.

The third interconnection portion 43 is inserted between the first and second interconnection portions 41 and 42, and electrically connects them. The third interconnection portion 43 has a V shape. The leading end (the leading end of the V shape) of the third interconnection portion 43 is arranged above the source region 25 of the selection transistors 12. The leading end of the third interconnection portion 43 is directly connected to the source region 25 using the contact layer 29.

The other end of the first interconnection portion 41 connects to another third interconnection portion 43. Likewise, the other end of the second interconnection portion 42 connects to another third interconnection portion 43. That is, the arrangement of a linear interconnection portion and V-shaped interconnection portion is alternately repeated to form one source line SL.

The plurality of active areas AA adjacent to each other in the Y-direction have translational symmetry. Note that "translational symmetry" represents that when a given active area AA is translated in one direction at a certain interval, it overlaps another active area AA. The plurality of source lines SL adjacent to each other in the Y-direction also have translational symmetry.

The MRAM having the above-described structure can reduce the area. Especially, it is possible to reduce the area in the Y-direction. More specifically, letting F be the minimum feature size determined by lithography and etching, the dimension of a memory cell MC in the X-direction is 3F while that in the Y-direction is 2F. Accordingly, the size of the memory cell MC is $6F^2$.

As the source line SL is corrugated, it can be directly connected to the source region 25 of the selection transistors 12 using the contact layer 29. This obviates the need for any extraction interconnection used to connect the source line SL to the source region 25 to result in a reduction in manufacturing cost.

The first embodiment has exemplified the case wherein a memory element 11 uses an MTJ element 11. However, it is also possible to use another type of memory element 11 such as a phase-change element 11. That is, the semiconductor memory device can use a phase-change RAM (PRAM).

The phase-change element 11 has a phase-change film 36 serving as a recording layer. FIG. 5 is a sectional view illustrating the arrangement of the phase-change element 11. The phase-change film 36 is sandwiched between the lower electrode 31 and the upper electrode 35.

The phase-change film 36 changes from a crystal phase to an amorphous phase or from an amorphous phase to a crystal phase due to heat generated upon supplying a current from the upper electrode 35 to the lower electrode 31. The phase-change film 36 has a low resistance value in a crystal phase (low-resistance state), while it has a high resistance value in an amorphous phase (high-resistance state).

The phase-change film 36 can be made of chalcogen compounds such as Ge—Sb—Te, In—Sb—Te, Ag—In—Sb—Te, and Ge—Sn—Te. These materials are desirable from the viewpoint of ensuring high-speed switchability, repetitive recording stability, and high reliability.

An operation for writing information in the memory cell MC including the phase-change element 11 and selection transistor 12 will be explained. First, a current pulse is supplied to the phase-change film 36 using the upper electrode 35 and lower electrode 31. The phase-change film 36 is heated by this current pulse. The current value of this current pulse is set such that the temperature of the phase-change film 36 becomes equal to or more than a crystallization temperature threshold value TH. The crystallization temperature threshold value TH is a temperature at which the phase-change film 36 changes from a crystal phase to an amorphous phase. The temperature of the phase-change film 36 heated by current pulse supply rapidly drops thereafter. At this time, the phase-change film 36 is in an amorphous phase (high-resistance state).

After the current pulse supply, a low current having a current value lower than before is supplied to the phase-change film 36. In this case, the temperature of the phase-change film 36 heated by current pulse supply drops slowly by low current supply. At this time, the phase-change film 36 is in a crystal phase (low-resistance state).

That is, the phase-change film 36 is heated by a current to a temperature equal to or more than the crystallization temperature threshold value TH. Upon fall of the supplied current pulse, the phase-change film 36 changes to a crystal phase (low-resistance state) if a temperature drop around the crystallization temperature threshold value TH is small, while it maintains an amorphous phase (high-resistance state) if a temperature drop around the crystallization temperature threshold value TH is large.

The state in which the phase-change film 36 is in an amorphous phase (high-resistance state) is defined as "1" data, while the state in which it is in a crystal phase (low-resistance state) is defined as "0" data. This makes it possible to write binary information in the memory cell MC. A current to be supplied to the phase-change film 36 is set by controlling the voltages of the bit line BL and source line SL, in the same manner as the above-described MRAM. An information read scheme is the same as that in the above-described MTJ element.

As described above, the first embodiment is also applicable to a PRAM using a phase-change element 11 as a memory element 11.

Second Embodiment

The second embodiment shows another arrangement of the source line SL. That is, the planar shape of a source line is made different from that of the source line SL shown in the first embodiment to reduce the area of the MRAM.

FIG. 6 is a plan view illustrating the arrangement of an MRAM according to the second embodiment of the present invention. FIG. 7 is a sectional view of the MRAM taken along a line VII-VII in FIG. 6. For the sake of easy understanding of the arrangement, an illustration (hatching) of an interlayer dielectric film formed between a substrate and an interconnection layer is omitted in FIG. 7. The circuit diagram of the MRAM according to the second embodiment is the same as that shown in the first embodiment.

As shown in FIG. 6, each source line SL runs in the X-direction and has a corrugated planar shape. More specifically, each source line SL includes a first interconnection portion 41, second interconnection portion 42, and third interconnection portion 43. The first and second interconnection portions 41 and 42 run in the X-direction and are adjacent to a bit line BL in the Y-direction while being spaced at a predetermined interval in the plan view (i.e., in the projection view from above). The first and second interconnection portions 41 and 42 sandwich the bit line BL. In other words, the first and second interconnection portions 41 and 42 are arranged on the opposite sides of the bit line BL.

The third interconnection portion 43 is inserted between the first and second interconnection portions 41 and 42, and electrically connects them. The third interconnection portion 43 runs in an oblique direction with respect to the X-direction. The middle portion of the third interconnection portion 43 is arranged above a source region 25 of selection transistors 12. This middle portion is directly connected to the source region 25 using a contact layer 29. The arrangement of a linear interconnection portion and an interconnection portion running in the oblique direction is alternately repeated to form one source line SL.

A plurality of active areas AA adjacent to each other in the Y-direction have translational symmetry. A plurality of source lines SL adjacent to each other in the Y-direction also have translational symmetry. A first metal interconnection layer M1 includes the source line SL. A second metal interconnection layer M2 formed on the first metal interconnection layer M1 via an interlayer dielectric film includes the bit line BL.

The MRAM having the above-described structure can also produce the same effect as that in the first embodiment. In the second embodiment, the dimension of a memory cell MC in the X-direction is 3 F while that in the Y-direction is 2 F. Accordingly, the size of the memory cell MC is 6 $F^2$.

The second embodiment is also applicable to a PRAM using a phase-change element 11 as a memory element 11.

Third Embodiment

In the third embodiment, a source line SL and bit line BL run in an oblique direction with respect to the direction in which an active area AA extends (or the direction in which a word line WL runs) to reduce the area of the MRAM.

Figure 8:
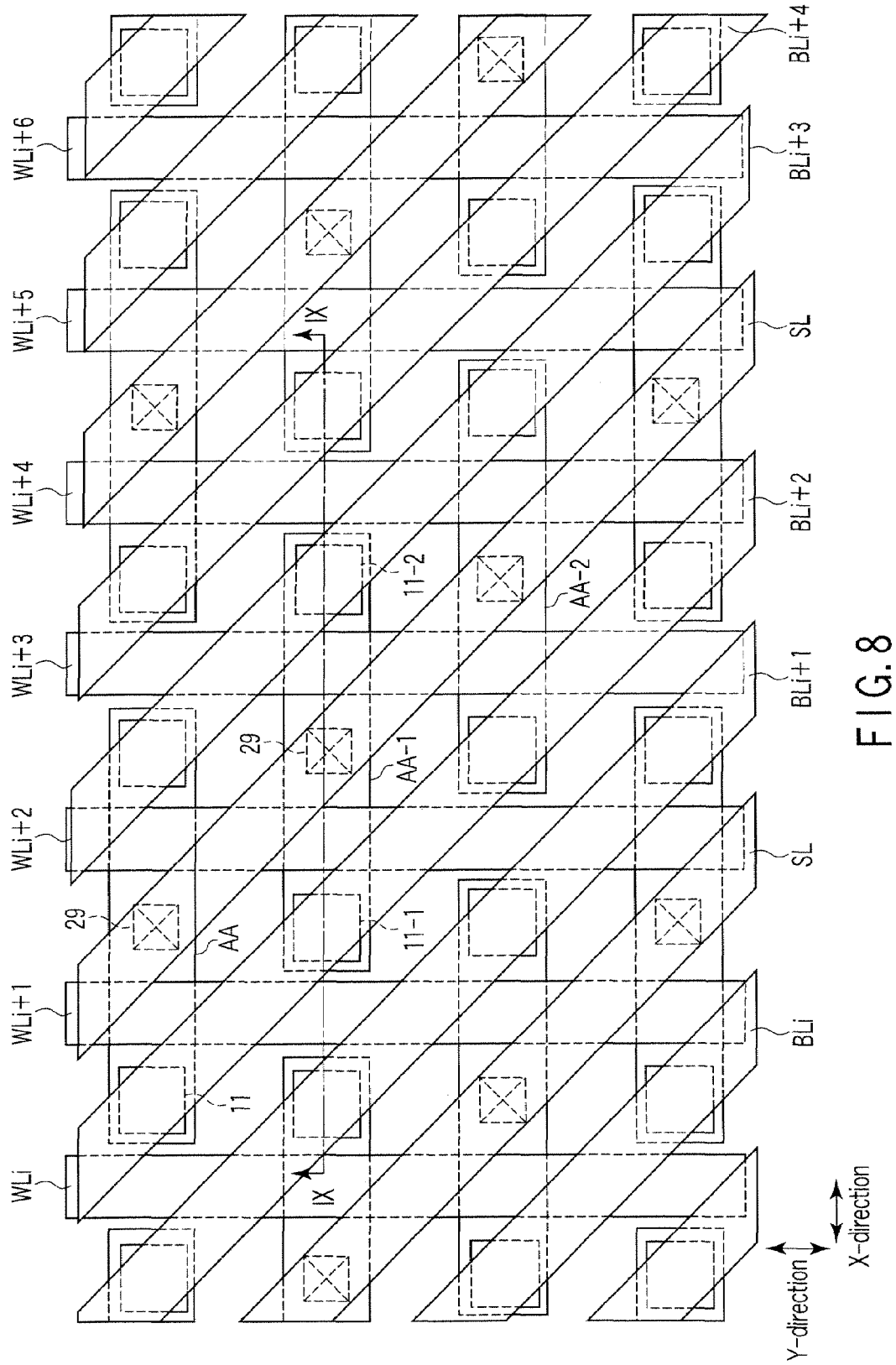
FIG. 8 is a plan view illustrating the arrangement of an MRAM according to a third embodiment of the present invention.
Figure 9:
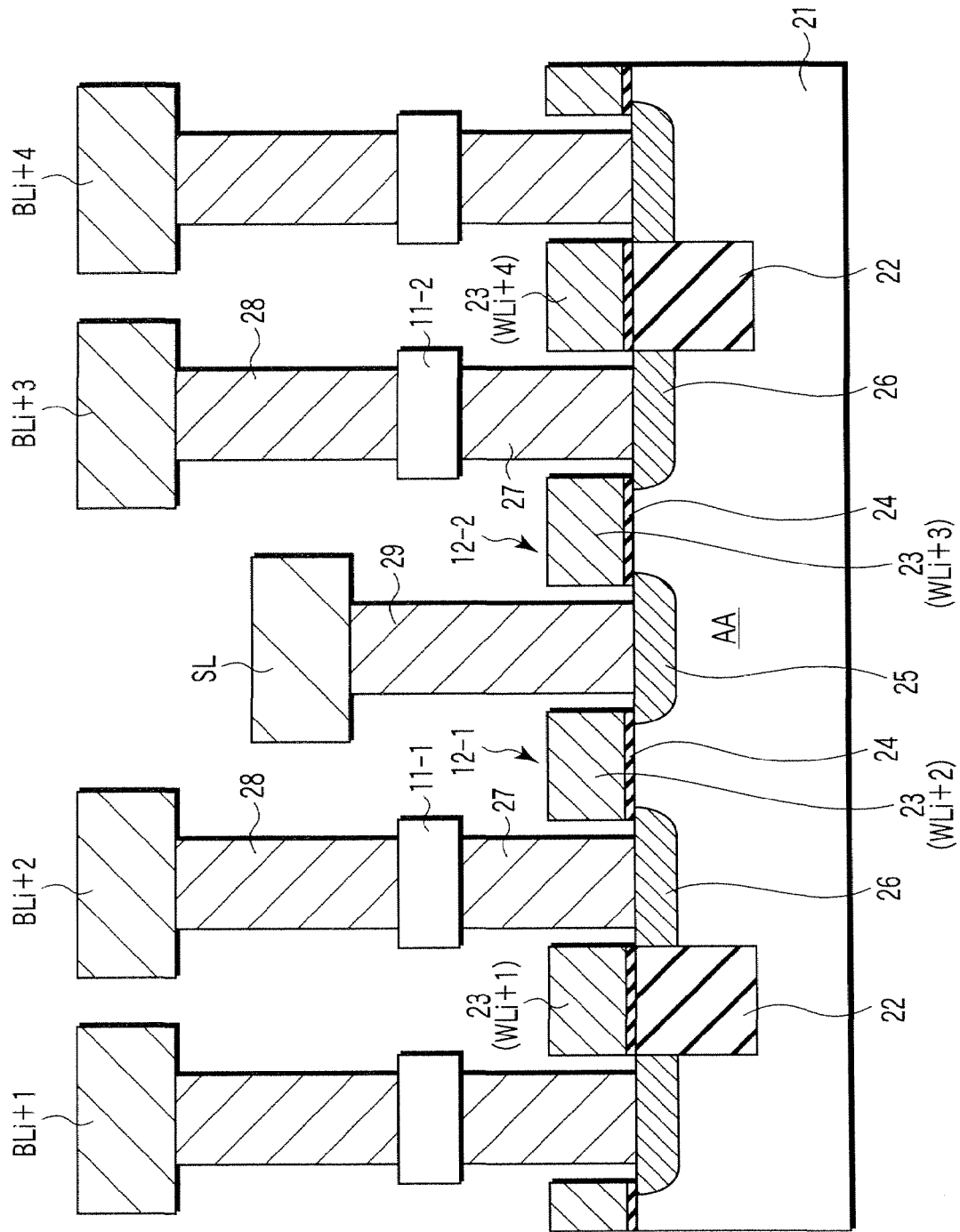
FIG. 9 is a sectional view of the MRAM taken along a line IX-IX in FIG. 8.

FIG. 8 is a plan view illustrating the arrangement of an MRAM according to the third embodiment of the present invention. FIG. 9 is a sectional view of the MRAM taken along a line IX-IX in FIG. 8. For the sake of easy understanding of the arrangement, an illustration (hatching) of an interlayer dielectric film formed between a substrate and an interconnection layer is omitted in FIG. 9.

A plurality of active areas AA are formed in a semiconductor substrate 21. Each active area AA extends in the X-direction. Two selection transistors 12 are formed on each active area AA. The two selection transistors 12 formed on the same active area AA share a source region 25. The two selection transistors 12 connect to a common source line SL via the source region 25.

As shown in FIG. 9, two selection transistors 12-1 and 12-2 share the source region 25. The selection transistor 12-1 connects to an MTJ element 11-1 via a contact layer 27. The MTJ element 11-1 connects to a bit line BLi+2 via a contact layer 28.

The selection transistor 12-2 connects to an MTJ element 11-2 via another contact layer 27. The MTJ element 11-2 connects to a bit line BLi+3 via another contact layer 28.

A plurality of gate electrodes 23 corresponding to a plurality of word lines WL are formed above the semiconductor substrate 21 via gate insulating films 24 to run in the Y-direction. The plurality of gate electrodes 23 are arranged at an equal interval.

Bit lines BL and source lines SL run in an oblique direction with respect to the X- or Y-direction. One source line SL is inserted between two bit lines BL. A first metal interconnection layer M1 includes the source line SL. A second metal interconnection layer M2 formed on the first metal interconnection layer M1 via an interlayer dielectric film includes the bit lines BL.

The plurality of active areas AA corresponding to a plurality of memory cells connected to the same bit line BL and the same source line SL are arranged adjacent to each other in an oblique direction that is the same as the direction in which the bit lines BL and source lines SL run. That is, the plurality of active areas adjacent to each other in the oblique direction have translational symmetry.

In other words, a first active area AA-1 and a second active area AA-2 adjacent to the first active area AA-1 in an oblique direction are arranged in the Y-direction while being spaced at a predetermined interval. Furthermore, the first active area AA-1 is shifted by one word line WL in the X-direction with respect to the second active area AA-2 adjacent to the first active area AA-1 in the oblique direction.

FIG. 10 is a circuit diagram of the MRAM shown in FIG. 8. A source line SL is inserted between the bit lines BLi+2 and BLi+3. A memory cell string connected to the bit line BLi+2 and that connected to the bit line BLi+3 share one source line SL.

The MRAM having the above-described structure can directly connect a source region 25 of selection transistors 12 to a source line SL using a contact layer 29. According to the third embodiment, it is also possible to reduce the area of the MRAM. In the third embodiment, the dimension of a memory cell MC in the X-direction is 3F while that in the Y-direction is 2F. Accordingly, the size of the memory cell MC is $6F^2$.

As in the first embodiment, the third embodiment is applicable to a PRAM using a phase-change element 11 as a memory element 11.

Fourth Embodiment

The fourth embodiment is a modification to the third embodiment, and shows another arrangement of the MRAM when a bit line runs in an oblique direction with respect to the direction in which an active area AA extends (or the direction in which a word line WL runs).

Figure 11:
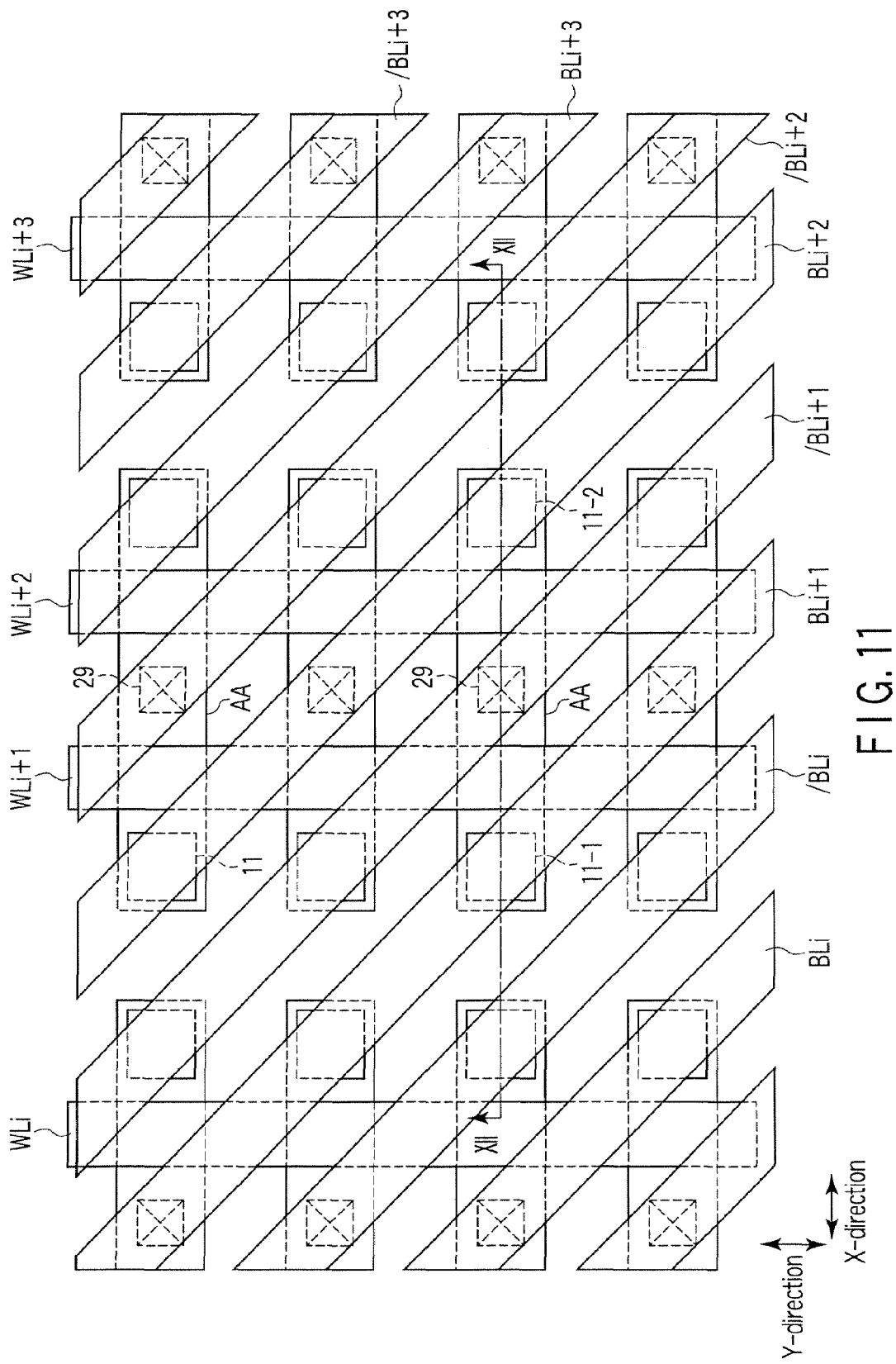
FIG. 11 is a plan view illustrating the arrangement of an MRAM according to a fourth embodiment of the present invention.
Figure 12:
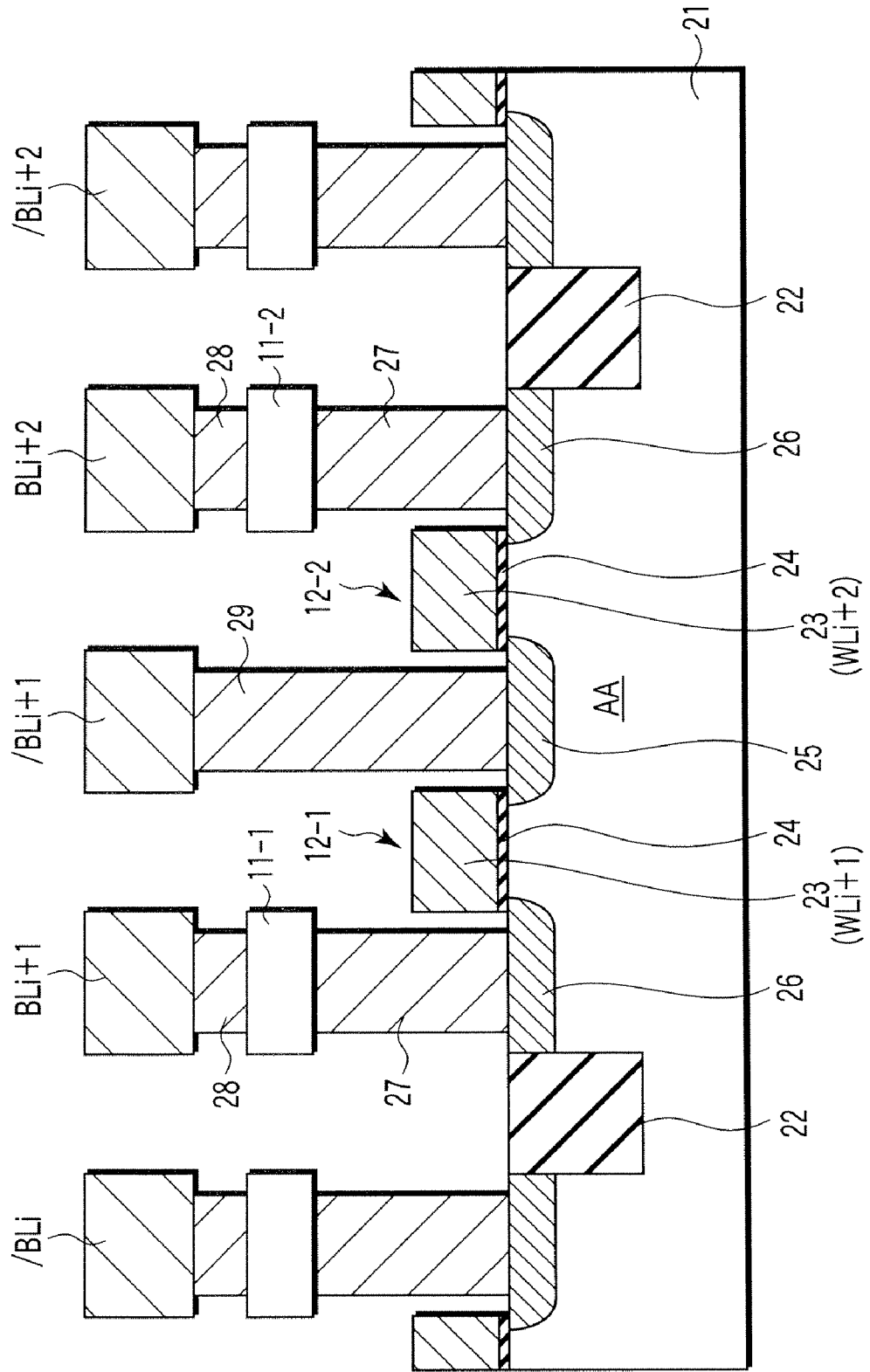
FIG. 12 is a sectional view of the MRAM taken along a line XII-XII in FIG. 11.

FIG. 11 is a plan view illustrating the arrangement of an MRAM according to the fourth embodiment of the present invention. FIG. 12 is a sectional view of the MRAM taken along a line XII-XII in FIG. 11. For the sake of easy understanding of the arrangement, an illustration (hatching) of an interlayer dielectric film formed between a substrate and an interconnection layer is omitted in FIG. 12. FIG. 13 is a circuit diagram of the MRAM shown in FIG. 11.

A plurality of active areas AA are formed in a semiconductor substrate 21. Each active area AA extends in the X-direction. The plurality of active areas AA adjacent to each other in the Y-direction have translational symmetry. A plurality of gate electrodes 23 corresponding to a plurality of word lines WL (in the fourth embodiment, word lines WLi to WLi+3) run in the Y-direction.

The MRAM comprises a plurality of first bit lines BL (in the fourth embodiment, bit lines BLi to BLi+3) and a plurality of second bit lines /BL (in the fourth embodiment, bit lines /BLi to /BLi+3). The first bit line BL and second bit line /BL run in an oblique direction with respect to the X- or Y-direction. The plurality of first bit lines BL and a plurality of second bit lines /BL are alternately arranged. A first metal interconnection layer M1 includes the plurality of first bit lines BL and the plurality of second bit lines /BL.

Two selection transistors 12 are formed on each active area AA. The two selection transistors 12 formed on the same active area AA share a source region 25. The two selection transistors 12 connect to a common bit line via the source region 25.

As shown in FIG. 12, two selection transistors 12-1 and 12-2 share the source region 25. The source region 25 connects to the second bit line /BLi+1 via a contact layer 29. The selection transistor 12-1 connects to an MTJ element 11-1 via a contact layer 27. The MTJ element 11-1 connects to the first bit line BLi+1 via a contact layer 28. The selection transistor 12-2 connects to an MTJ element 11-2 via another contact layer 27. The MTJ element 11-2 connects to the first bit line BLi+2 via another contact layer 28.

As shown in FIG. 13, each of a first bit line BL and second bit line /BL connects to an MTJ element 11 and selection transistor 12. More specifically, an arbitrary first bit line BL connects to the upper electrode of an MTJ element 11 included in a memory cell MC, and to the source region of a selection transistor 12 included in another memory cell MC.

Likewise, an arbitrary second bit line /BL connects to the upper electrode of an MTJ element 11 included in a memory cell MC, and to the source region of a selection transistor 12 included in another memory cell MC.

The MRAM having the above-described structure can directly connect a source region 25 of selection transistors 12 to a source line SL using a contact layer 29. According to the fourth embodiment, it is also possible to reduce the area of the MRAM. In the fourth embodiment, the dimension of a memory cell MC in the X-direction is 3F while that in the Y-direction is 2F. Accordingly, the size of the memory cell MC is $6F^2$.

As the first bit lines BL and second bit lines /BL can be formed in the same interconnection layer, one interconnection layer of the MRAM can be omitted. This makes it possible to decrease the number of manufacturing steps to result in a reduction in manufacturing cost. This also allows the micropatterning of the MRAM in the longitudinal direction.

As in the first embodiment, the fourth embodiment is applicable to a PRAM using a phase-change element 11 as a memory element 11.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   a bit line which is provided above the semiconductor substrate and runs in a first direction;
   a source line which is provided above the semiconductor substrate and runs in the first direction;
   an active area which is provided in the semiconductor substrate and extends in the first direction;
   a first selection transistor and a second selection transistor which are formed on the active area and share a source region electrically connected to the source line;
   a first memory element having one end electrically connected to a drain region of the first selection transistor and the other end electrically connected to the bit line; and
   a second memory element having one end electrically connected to a drain region of the second selection transistor and the other end electrically connected to the bit line,
   wherein the source line includes a first interconnection portion and a second interconnection portion which run in the first direction and are adjacent to the bit line in a second direction perpendicular to the first direction, and a third interconnection portion which connects the first interconnection portion to the second interconnection portion and is electrically connected to the source region.

2. The device according to claim 1, wherein
   the first interconnection portion and the second interconnection portion are adjacent to the bit line on the same side, and
   the third interconnection portion has a V shape.

3. The device according to claim 1, wherein
   the first interconnection portion and the second interconnection portion are adjacent to the bit line on both sides, and
   the third interconnection portion runs obliquely with respect to the first direction.

4. The device according to claim 1, further comprising a contact layer which electrically connects the third interconnection portion to the source region.

5. The device according to claim 1, further comprising a first word line and a second word line which are provided above the semiconductor substrate via an insulating film, run in the first direction, and correspond to gate electrodes of the first selection transistor and the second selection transistor.

6. The device according to claim 1, wherein
the source line is formed in a first level layer, and
the bit line is formed in a second level layer formed on the first level layer.

7. The device according to claim 1, wherein a plurality of source lines have translational symmetry along the second direction.

8. The device according to claim 1, wherein a plurality of active areas have translational symmetry along the second direction.

9. The device according to claim 1, wherein
the memory element is a magnetoresistive element, and
the magnetoresistive element includes a fixed layer having a fixed magnetization direction, a recording layer having a magnetization direction which changes, and a non-magnetic layer sandwiched between the fixed layer and the recording layer.

10. The device according to claim 1, wherein
the memory element is a phase-change element, and
the phase-change element includes a first electrode, a second electrode, and a phase-change film sandwiched between the first electrode and the second electrode.

11. A semiconductor memory device comprising:
a semiconductor substrate;
an active area which is provided in the semiconductor substrate and extends in a first direction;
a first selection transistor and a second selection transistor which are provided on the active area and share a source region;
a first memory element having one end electrically connected to a drain region of the first selection transistor;
a second memory element having one end electrically connected to a drain region of the second selection transistor;
a first interconnection and a second interconnection which are provided above the semiconductor substrate, are electrically connected to the other ends of the first memory element and the second memory element, respectively, and run in an oblique direction with respect to the first direction; and
a third interconnection which is provided above the semiconductor substrate, is electrically connected to the source region, and runs in the oblique direction.

12. The device according to claim 11, wherein a plurality of active areas have translational symmetry along the oblique direction.

13. The device according to claim 12, wherein
the first interconnection is a first bit line,
the second interconnection is a second bit line, and
the third interconnection is a source line.

14. The device according to claim 13, wherein
the source line is formed in a first level layer, and
the first bit line and the second bit line are formed in a second level layer formed on the first level layer.

15. The device according to claim 11, wherein a plurality of active areas have translational symmetry along a second direction perpendicular to the first direction.

16. The device according to claim 15, wherein the first interconnection, the second interconnection, and the third interconnection are formed in a common level layer.

17. The device according to claim 11, further comprising:
a first word line which is provided above the semiconductor substrate via an insulating film, runs in the first direction, and corresponds to a gate electrode of the first selection transistor; and
a second word line which is provided above the semiconductor substrate via an insulating film, runs in the first direction, and corresponds to a gate electrode of the second selection transistor.

18. The device according to claim 11, further comprising a contact layer which electrically connects the third interconnection to the source region.

19. The device according to claim 11, wherein
the memory element is a magnetoresistive element, and
the magnetoresistive element includes a fixed layer having a fixed magnetization direction, a recording layer having a magnetization direction which changes, and a non-magnetic layer sandwiched between the fixed layer and the recording layer.

20. The device according to claim 11, wherein
the memory element is a phase-change element, and
the phase-change element includes a first electrode, a second electrode, and a phase-change film sandwiched between the first electrode and the second electrode.

* * * * *